(12) United States Patent
Ahmed (10) Patent No.: US 10,753,735 B2
(45) Date of Patent: Aug. 25, 2020

(54) COMPUTATIONALLY EFFICIENT STRUCTURED LIGHT IMAGING SYSTEM

(71) Applicant: INTEL CORPORATION, Santa Clara, CA (US)

(72) Inventor: Khaled Ahmed, Anaheim, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/209,444

(22) Filed: Dec. 4, 2018

(65) Prior Publication Data

US 2019/0107389 A1 Apr. 11, 2019

(51) Int. Cl.
| | |
|---|---|
| *G01B 11/25* | (2006.01) |
| *G06K 9/00* | (2006.01) |
| *G06T 7/521* | (2017.01) |
| *G06K 9/32* | (2006.01) |
| *H01S 5/065* | (2006.01) |
| *H01S 5/10* | (2006.01) |

(Continued)

(52) U.S. Cl.
CPC ...... *G01B 11/2513* (2013.01); *G06K 9/00201* (2013.01); *G06K 9/3216* (2013.01); *G06T 7/521* (2017.01); *H01S 5/0651* (2013.01); *H01S 5/0655* (2013.01); *H01S 5/1092* (2013.01); *H01S 5/183* (2013.01); *H01S 5/40* (2013.01); *G06K 2209/401* (2013.01)

(58) Field of Classification Search
CPC .... H01S 5/0651; H01S 5/0655; H01S 5/1092; H01S 5/183; H01S 5/18311; H01S 5/40; H01S 5/4025; G01B 11/2513; G06T 7/5221; G06K 9/3216; G06K 2209/401
See application file for complete search history.

(56) References Cited

U.S. PATENT DOCUMENTS

| | | | | |
|---|---|---|---|---|
| 5,745,152 | A * | 4/1998 | Vincent | B41J 2/45 347/238 |
| 8,320,621 | B2 * | 11/2012 | McEldowney | G03B 17/54 356/5.01 |

(Continued)

OTHER PUBLICATIONS

Leshin, et al., "Lithographic VCSEL array multimode and single mode soures for sensing and 3D imaging," Proc. of SPIE vol. 9854, 98540Y, 2016. 8 pages.

*Primary Examiner* — Armando Rodriguez
(74) *Attorney, Agent, or Firm* — Finch & Maloney PLLC (57) ABSTRACT

A laser source for use in a structured light projector includes a substrate, one or more first VCSELs on the substrate, and one or more second VCSELs on the substrate. The one or more first VCSELs each have a first aperture width and each separately extend above a surface of the substrate. The one or more second VCSELs each have a second aperture width different from the first aperture width, and each separately extend above a surface of the substrate. Using an array of VCSELs with different aperture widths provides emitted radiation having different wavelengths, thus providing different speckle patterns. When the different speckle patterns are averaged upon being received at the detector, speckle noise is reduced. The VCSEL can also include a plurality of subwavelength structures to steer the light output. Such subwavelength structures can also be used on the surface of other VCSELs, including standard VCSELs.

22 Claims, 9 Drawing Sheets

(51) Int. Cl.
*H01S 5/40* (2006.01)
*H01S 5/183* (2006.01)

(56) References Cited

U.S. PATENT DOCUMENTS

| 8,749,796 | B2 * | 6/2014 | Pesach | G01B 11/25 |
| | | | | 356/610 |
| 9,091,413 | B2 * | 7/2015 | Petronius | G02B 26/105 |
| 2017/0353012 | A1 * | 12/2017 | Barve | H01S 5/423 |
| 2018/0203247 | A1 * | 7/2018 | Chen | G03B 21/2033 |

* cited by examiner

COMPUTATIONALLY EFFICIENT STRUCTURED LIGHT IMAGING SYSTEM

BACKGROUND

One approach to creating a 3D image is called a structured light illumination (SLI) technique. In an SLI technique, a light pattern is projected onto a 3D object surface. The SLI system includes a camera and projector (illuminator). The 3D object is placed at a reference plane that is a predetermined distance from the projector and camera. In use, the projector projects a structured light pattern onto the 3D object surface. The structured light pattern can be a series of striped lines or a grid or any other pattern. When the structured light pattern is projected onto the 3D object surface, it is distorted by the 3D object surface. The camera captures an image of the 3D object surface with the distortions in the structured light pattern. The image is then stored in an image file for processing by an image processing device. In some cases, multiple structured light patterns are projected onto the 3D object surface by the projector (illuminator), and multiple images of the 3D object with the structured light patterns are captured by the camera. During processing of the image files, the distortions in the structured light pattern are analyzed and calculations performed to determine a spatial measurement of various points on the 3D object surface with respect to the reference plane. This processing of the images uses standard range-finding or triangulation methods. The triangulation angle between the camera and projected pattern causes a distortion directly related to the depth of the surface. Once these range finding techniques are used to determine the position of a plurality of points on the 3D object surface, then a 3D data representation of the 3D object can be created. Digital recreation of 3D objects has uses in numerous fields, including image recognition (such as facial recognition, feature extraction from an image, etc.), and robotics to improve the interaction between a robot and its environment. There remain, however, a number of unresolved issues associated with SLI.

BRIEF DESCRIPTION OF THE DRAWINGS

Features and advantages of embodiments of the claimed subject matter will become apparent as the following Detailed Description proceeds, and upon reference to the Drawings, in which:

Although the following Detailed Description will proceed with reference being made to illustrative embodiments, many alternatives, modifications, and variations thereof will be apparent in light of this disclosure.

DETAILED DESCRIPTION

A laser source for use in a structured light projector includes a substrate, one or more first VCSELs on the substrate, and one or more second VCSELs on the substrate. The one or more first VCSELs each have a first aperture width and each separately extend above a surface of the substrate. The one or more second VCSELs each have a second aperture width different from the first aperture width, and each separately extend above a surface of the substrate. The first and second VCSELs can be patterned using lithography, according to some embodiments. Using an array of VCSELs with different aperture widths provides emitted radiation having different wavelengths, thus providing different speckle patterns. When the different speckle patterns are averaged upon being received at the detector, speckle noise is reduced. The VCSEL can also include a plurality of subwavelength structures to steer the light output. Such subwavelength structures can also be used on the surface of other VCSELs, including standard VCSELs. In any such cases, the laser source can be combined with an image sensor to provide a light projector system.

General Overview

As noted above, there remain a number of unresolved issues associated with structured light illumination (SLI). In more detail, a suitable structured light projector typically includes a laser device that employs diffraction patterns to achieve a desired structured light pattern. One example laser device is a vertical-cavity surface-emitting laser (VCSEL) used in conjunction with laser stripes. There are, however, limitations associated with such configurations. For instance, limitations of using laser stripes to obtain accurate profile information are mainly attributed to sampling error and the noise associated with the laser because the center of a laser stripe may not be imaged at the center of the pixel of the camera and may not be the detected intensity peak. Sampling error occurs while locating the center of the laser stripe on the image. There are image processing techniques such as maximum intensity, intensity center, Gaussian fitting and zero-crossing which attempt to extract the relevant information from the laser stripe. The associated problem with several of these techniques is that it gives the location of the highest peak, which is not the true center of the stripe. The noise associated with the laser primarily takes the form of laser speckle, which is the oscillation of the intensity profile for a laser when it is reflected from the surface of the part and is caused by coherency of the laser. Laser speckle can be compensated for using digital post-processing on the received image. But this can be computationally intensive and leads to relatively higher power consumption and further leads to a delay in the creation of the 3D image.

Thus, and according to an embodiment of the present disclosure, a structured light projector employs a new laser source design that reduces or substantially eliminates laser speckle without increasing the computational load, relative to standard techniques. In addition, because the occurrence of laser speckle is managed or otherwise reduced from the onset (effectively at image capture time, by way of the laser source design), the need for speckle-based post-processing on the captured image is also eliminated or otherwise reduced. According to an embodiment, a laser source for use in a structured light projector includes a substrate, one or more first VCSELs arranged on the substrate, and one or more second VCSELs arranged on the substrate. The one or more first VCSELs each have a first aperture width and each separately extend above a surface of the substrate. The one or more second VCSELs each have a second aperture width different from the first aperture width, and each separately extend above a surface of the substrate. Using an array of VCSELs with different aperture widths provides emitted radiation having different wavelengths, thus providing different speckle patterns. When the different speckle patterns are averaged upon being received at the detector, the speckle noise is reduced or substantially eliminated.

The light being emitted from the various VCSEL structures can be modulated to form the specific pattern (grid, dot matrix, etc.) on an object. The modulation can involve creating regions of constructive and destructive interference to effectively "pattern" the light output into any desired pattern. Various techniques can be used to modulate the light, including the incorporation of optical components such as lenses and diffractive elements. However, the embodiments described herein integrate subwavelength structures (SWS) that incorporate two or more materials directly onto the VCSEL structures to steer the light output. The subwavelength structures include dense arrangements of surface structures smaller than the wavelength of light that function as resonant optical antennas. The resonant nature of the light-surface structure interaction provides the ability to manipulate optical wave-fronts.

According to another embodiment, a laser source includes a substrate, a VCSEL structure, and a plurality of subwavelength structures. The VCSEL structure is arranged on a surface of the substrate and extends above the surface of the substrate. The plurality of subwavelength structures is arranged on a top layer of the VCSEL structure. One or more of the plurality of subwavelength structures includes a core material and a shell material disposed on one or more surfaces of the core material. Note that the subwavelength structures can be used in conjunction with a VCSEL structures as provided herein according to some embodiments, or any other VCSEL structures according to other embodiments, as will be appreciated in light of this disclosure.

VCSEL Array Architecture

Figure 1:
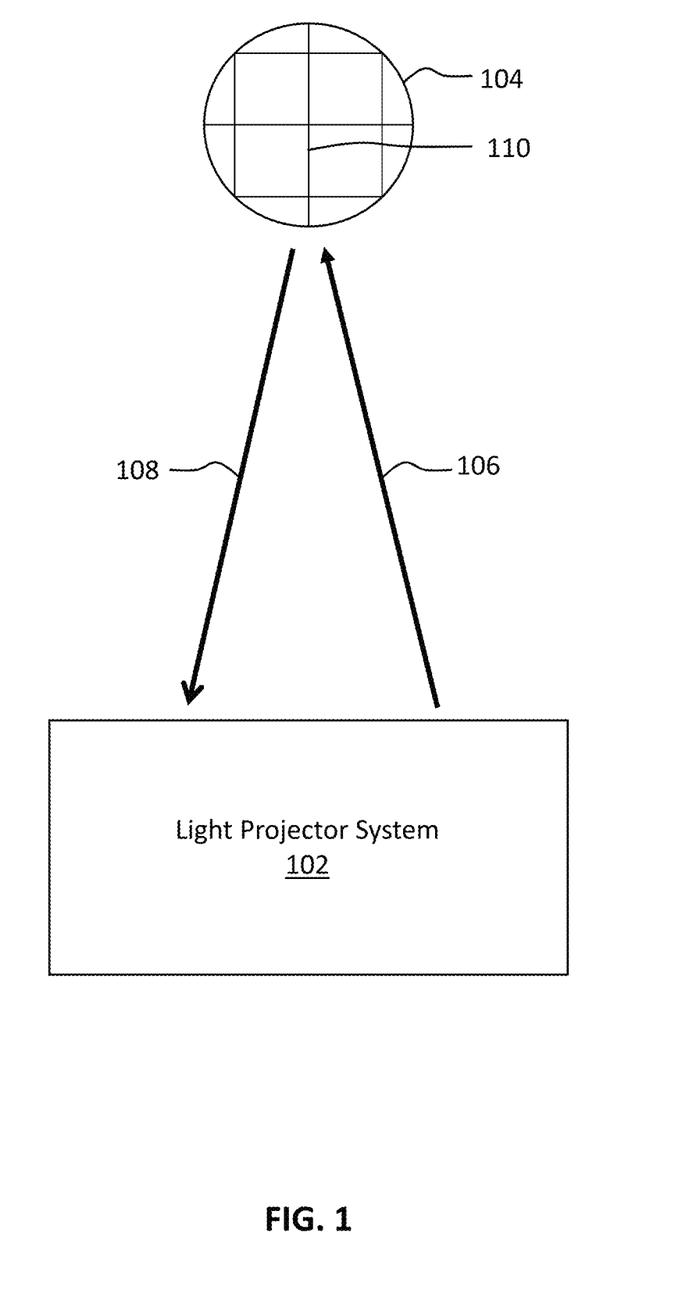
FIG. 1 illustrates a light projector system configured in accordance with an embodiment of the present disclosure.

FIG. 1 illustrates an example light projector system 102 used to create a 3D image of an object 104 in accordance with an embodiment of the present disclosure. Object 104 may be an object of any size or shape disposed at a given distance away from light projector system 102. Light projector system 102 is designed to emit radiation 106 towards object 104 and receive reflected radiation 108 in order to generate a 3D image or model of object 104. Example components of light projector system 102 are discussed in further detail with regards to FIG. 2.

Emitted radiation 106 forms a light pattern 110 upon a surface or multiple surfaces of object 104. Light pattern 110 may be a grid (as illustrated in FIG. 1) or may have any other pre-determined pattern. The reflected radiation 108 from light pattern 110 is used to determine depth of various points across object 104 and may be used to recreate a 3D representation of object 104.

Emitted radiation 106 and received radiation 108 may be visible light having a wavelength in a range between about 400 nm and about 700 nm. In another example, emitted radiation 106 and received radiation 108 include near infrared radiation having a wavelength in a range between about 700 nm and about 1400 nm. In one example, emitted radiation 106 and received radiation 108 each include wavelengths in a range between about 935 nm and about 945 nm.

Figure 2:
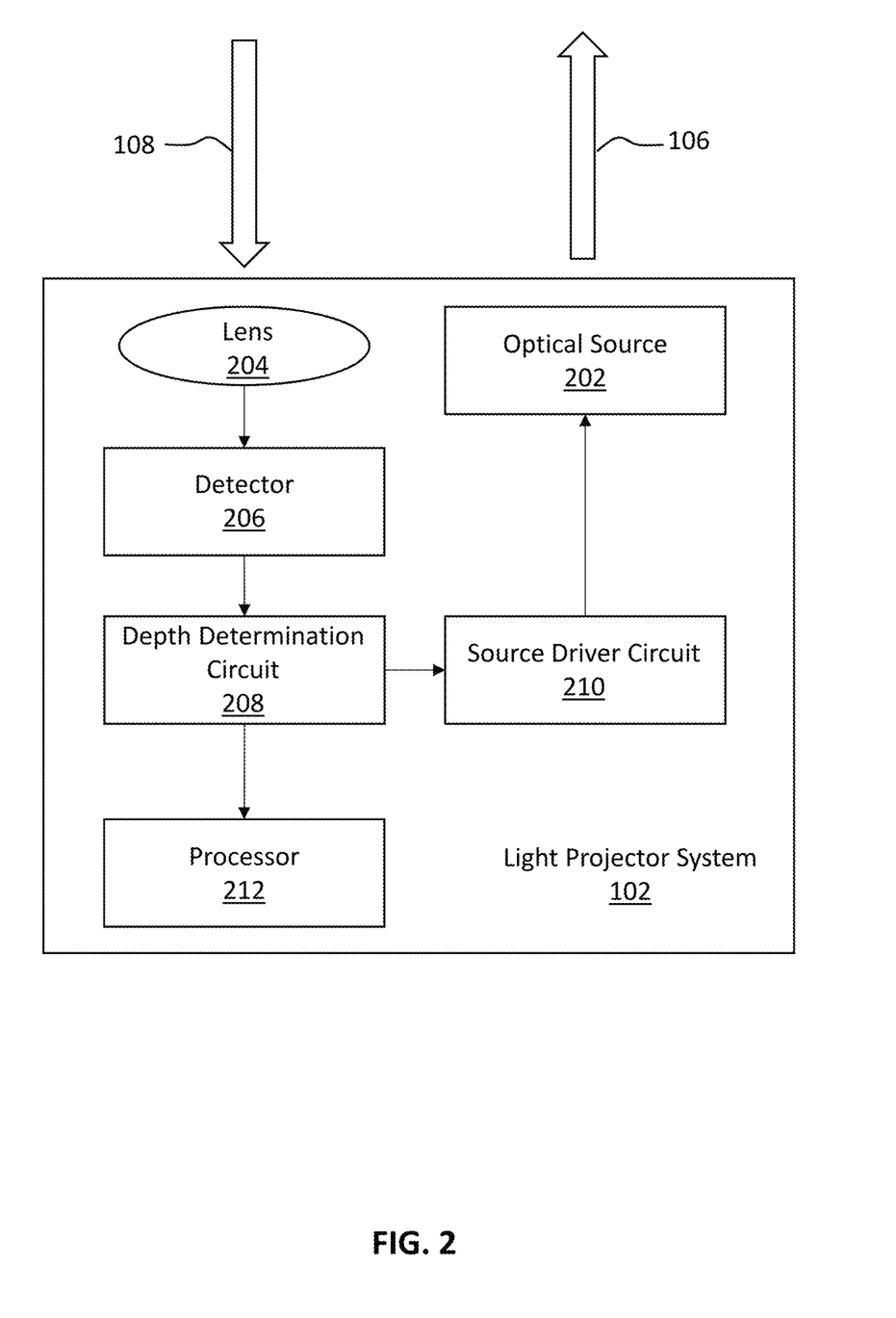
FIG. 2 provides a more detailed illustration of the light projector system configured in accordance with an embodiment of the present disclosure.

FIG. 2 illustrates the various components of a light projector system 102, in accordance with an embodiment. Light projector system 102 includes an optical source 202, a lens 204, a detector 206, a depth determination circuit 208, a source driver circuit 210, and a processor 212. Optical source 202 may be designed to generate and emit radiation 106 towards an object. Optical source 202 may be a laser source that includes one or more laser diodes or laser cavities for generating radiation 106.

According to an embodiment, optical source 202 includes a plurality of VCSELs for generating radiation 106. The plurality of VCSELs may be arranged on a substrate, such as a silicon or other semiconducting substrate, as described in more detail with regards to FIGS. 3 and 4.

Lens 204 may represent any number of lens elements used to collect received radiation 108 and direct the received radiation towards detector 206, as will be appreciated in light of this disclosure. Detector 206 receives radiation 108 and transduces the received radiation into an electrical signal that is sent to depth determination circuit 208. Detector 206 may be a charge coupled device (CCD) or may use a complementary metal-oxide-semiconductor (CMOS) array for collecting the radiation.

Depth determination circuit 208 is configured to receive the image acquisition data from detector 206 and determine one or more spatial measurements across a plurality of points on the surface of the object based on the reference plane. The measurements may be calculated based on the distortions of the light pattern projected onto the object. This processing of the images may use well-known techniques in the industry, such as standard range-finding or triangulation methods.

In some embodiments, a source driver circuit 210 is included within light projector system 102 and is configured to control the operation of optical source 202. Accordingly, source driver circuit 210 may be configured to provide power to optical source 202, and more specifically, to control a duty cycle of the power being applied to optical source 202. In some embodiments, depth determination circuit 208 may provide a signal to source driver circuit 210 to change how optical source 202 is operating. For example, if depth determination circuit 208 finds that the received image is too dim to make a meaningful determination, it may provide a signal to source driver circuit 210 to increase the power output, or the duty cycle, of optical source 202.

Processor 212 may be provided to perform any additional computations required for digitally recreating the 3D object. Processor 212 may be any general-purpose processing device or microcontroller, as will be appreciated in light of this disclosure. In some embodiments, processor 212 is configured to store the digitally recreated 3D object in a memory (not shown). The stored digital 3D objects may be indexed by type, location, size, or any other qualifying factors. The stored 3D digital objects may be used by various applications such as image recognition software.

Figure 3:
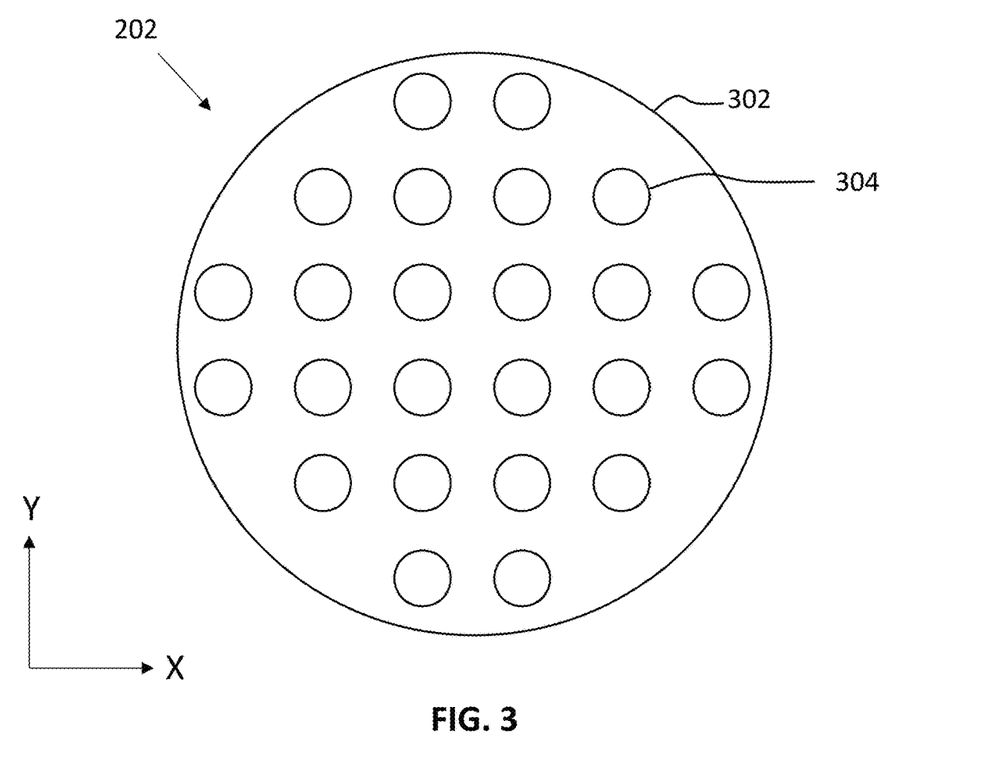
FIG. 3 illustrates a top-down view of an optical source used in a light projector system, in accordance with an embodiment of the present disclosure.

FIG. 3 illustrates a top-down view of an optical source 202, or at least a portion of an optical source 202, according to an embodiment. Optical source 202 includes a substrate 302 having a plurality of VCSEL structures 304 arranged on a surface of substrate 302. Substrate 302 in some embodiments, may be: a bulk substrate including group IV semiconductor material (e.g., Si, Ge, SiGe), group III-V semiconductor material (e.g., GaAs, GaAsSb, GaAsIn), and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. In some embodiments, substrate 302 is a glass substrate (such as a PYREX substrate or borosilicate glass substrate) or a sapphire substrate ($Al_2O_3$).

Each VCSEL structure 304 is separately distinguished from one another across the surface of substrate 302, according to an embodiment. Each VCSEL structure 304 includes a layer stack having a plurality of mirror layers (such as Bragg reflectors) that sandwich a plurality of quantum well layers to generate laser radiation directed out of the top of each VCSEL structure 304 and normal to the surface of substrate 302.

Each VCSEL 304 may be arranged in an ordered fashion across the surface of substrate 302. In one example, VCSELs 304 are arranged in a 2D array pattern, each separated by a same distance in both an X-direction and a Y-direction across the surface of the substrate 302. VCSELs 304 may be arranged in other ordered patterns as well or may be arranged in a pseudo-random pattern.

Although substrate 302 is illustrated as having a round shape, this is not intended to be limiting, and substrate 302 may have any shape or size. In some embodiments, substrate 302 is a die from a larger substrate having dimensions on the order of millimeters or centimeters in the X-direction and the Y-direction. Also, any number of VCSELs 304 may be arranged on substrate 302 from hundreds of VCSELs to millions of VCSELs, or even more in some embodiments.

Figure 4:
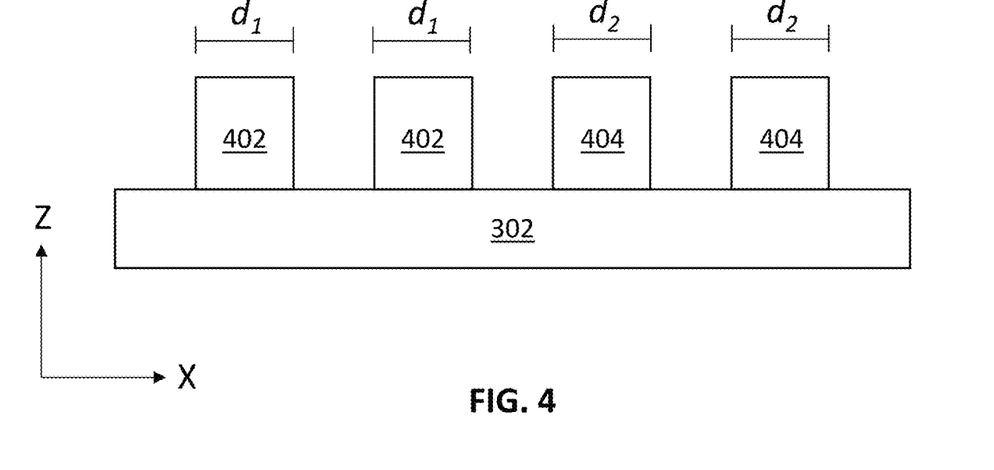
FIG. 4 illustrates a side view of an optical source used in a light projector system, in accordance with an embodiment of the present disclosure.

FIG. 4 illustrates a side view of substrate 302 having a first plurality of VCSELs 402 and a second plurality of VCSELs 404, according to an embodiment. Each of first plurality of VCSELs 402 and second plurality of VCSELs 404 separately extend away from the surface of substrate 302, and may have a thickness in the Z-direction anywhere between about 500 μm and 2 mm. Any number of VCSEL structures may be present within first plurality of VCSELs 402 and second plurality of VCSELs 404.

It should be understood that the dimensions shown are not drawn to scale and are only provided as such for clarity. For example, substrate 302 is shown as having a thickness (dimension in the Z-axis direction) similar to the thickness of each of VCSELs 402 or 404. But substrate 302 may be much thicker than the other layers, such as having a thickness in the range of 50 μm to 950 μm, for example, or any other suitable thickness as will be apparent in light of this disclosure.

According to an embodiment, an aperture width ($d_1$, analogous to the diameter) of each of first plurality of VCSELs 402 is different than an aperture width ($d_2$) of each of second plurality of VCSELs 404. By changing the aperture size, the number of transverse lasing modes also changes along with the peak wavelength of the dominant transverse lasing mode. In other words, each set of VCSELs having a same aperture width produces its own speckle pattern, since the speckle pattern is dependent upon the wavelength of the illuminating light. In the example illustrated in FIG. 4, first plurality of VCSELs 402 would produce a first speckle pattern while second plurality of VCSELs 404 would produce a second, different speckle pattern.

Speckle reduction is based on averaging N independent speckle configurations within the spatial and temporal resolution of the detector. For example, in a situation where all the N independent speckle configurations have equal mean intensities, the speckle noise is reduced by a factor of $\sqrt{N}$. Because the speckle pattern depends on the wavelength of the illuminating light, the speckle patterns from two beams with different wavelengths become uncorrelated if the average relative phase-shift created by the surface is $\geq 2\pi$. This means that the aperture widths of the various VCSELs should be designed such that the emission wavelength difference between the VCSELs is given by:

$$\delta\lambda \geq \lambda^2/2z \quad (1)$$

Where z is the surface profile height variation of the illuminated surface of the object. For an example peak emission wavelength of 940 nm and z=0.1 mm, the wavelength difference should be ≥4.4 nm.

Figure 5:
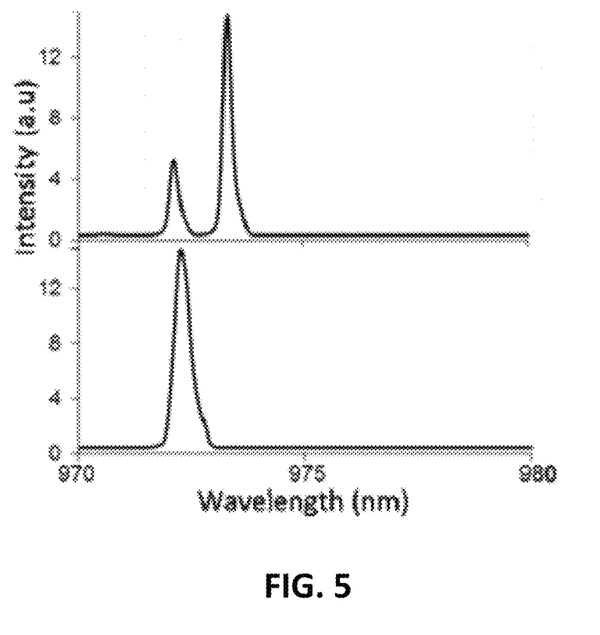
FIG. 5 provides example lasing spectra of devices having different aperture widths, in accordance with an embodiment of the present disclosure.

FIG. 5 is a graph showing the lasing spectra of two different VCSEL arrays having different aperture widths, according to an embodiment. The top spectra is measured from a first VCSEL array, where each VCSEL structure has an aperture width of 4 μm. The bottom spectra is measured from a second VCSEL array, where each VCSEL structure has an aperture width of 2 μm. As can be seen from the spectra, the first VCSEL array with the larger aperture size includes two transverse lasing modes and a dominate mode with a peak wavelength around 973 nm. In contrast, the second VCSEL array includes only a single lasing mode with its peak wavelength around 972 nm. By changing the aperture size, both the number of transverse lasing modes and the peak wavelength of the emission can change, yielding a different speckle pattern.

Figure 6:
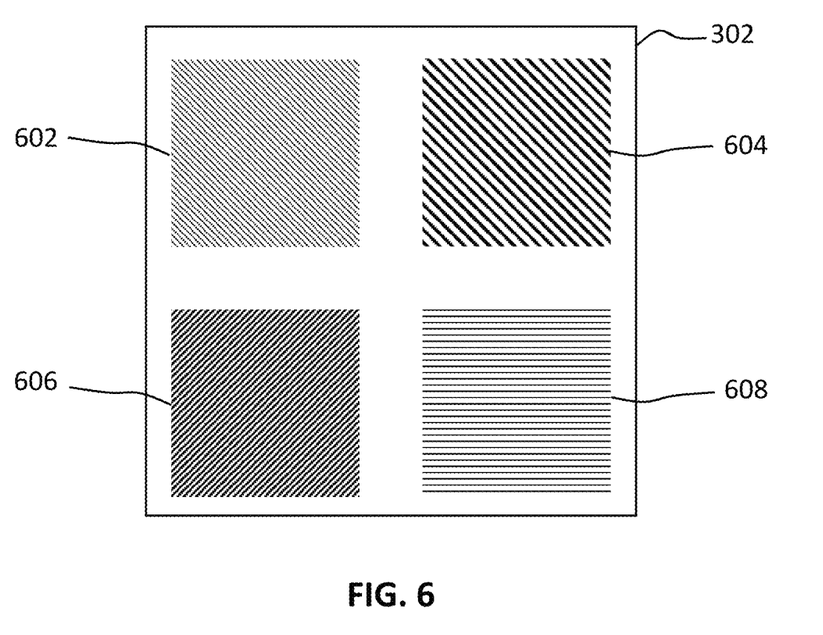
FIG. 6 illustrates a top-down view of an optical source used in a light projector system, in accordance with an embodiment of the present disclosure.

FIG. 6 illustrates another example of an optical source having substrate 302 with various regions of VCSEL structures having different aperture widths, according to an embodiment. Substrate 302 includes a first region 602 having a plurality of VCSELs with a first aperture width ($d_1$), a second region 604 having a plurality of VCSELs with a second aperture width ($d_2$), a third region 606 having a plurality of VCSELs with a third aperture width ($d_3$), and a fourth region 608 having a plurality of VCSELs with a fourth aperture width ($d_4$). Each of the aperture widths $d_1$–$d_4$ may differ from one another by a same amount. For example, each of the aperture widths $d_1$–$d_4$ may differ by 500 nm, by 1 μm, by 2 μm, or by 3 μm. In another example, the aperture widths $d_1$–$d_4$ may be any values within a given range, such as between 1 μm and 10 μm. In the illustrated example having four regions of VCSEL arrays with different aperture widths (producing four different speckle patterns), the total speckle noise is reduced by about 50% ($\sqrt{N}$ with N=4). Although only four regions are illustrated in FIG. 6, any number of regions each having an array of VCSELs with a given aperture width may be included on the surface of substrate 302. Additionally, each of the regions may have any shape or size. In some embodiments, any region may overlap with any other region either partially or fully.

Subwavelength Structure Integration

Subwavelength structures (SWS) provide opportunities to realize virtually flat, aberration-free optics on much smaller scales, in comparison with geometrical optics. SWS may be composed of arrays of subwavelength scatterers that manipulate the wavefront, polarization, or intensity of light. Like most diffraction-based optical devices, SWS are usually designed to optimally operate at one wavelength or over a narrow range of wavelengths. One example of SWS includes dielectric transmit arrays that provide high transmission and subwavelength spatial control of both polarization and phase. These devices are based on subwavelength arrays of high refractive-index dielectric nanoresonators (scatterers) with different geometries, fabricated on a planar substrate. Scatterers with various geometries impart different phases to the transmitted light, shaping its wavefront to a desired form. When centrosymmetric subwavelength features such as pillars or cylinders are used as the scatterers, the SWS device can be operated with unpolarized light (like that coming out of VCSELs).

Figure 7:
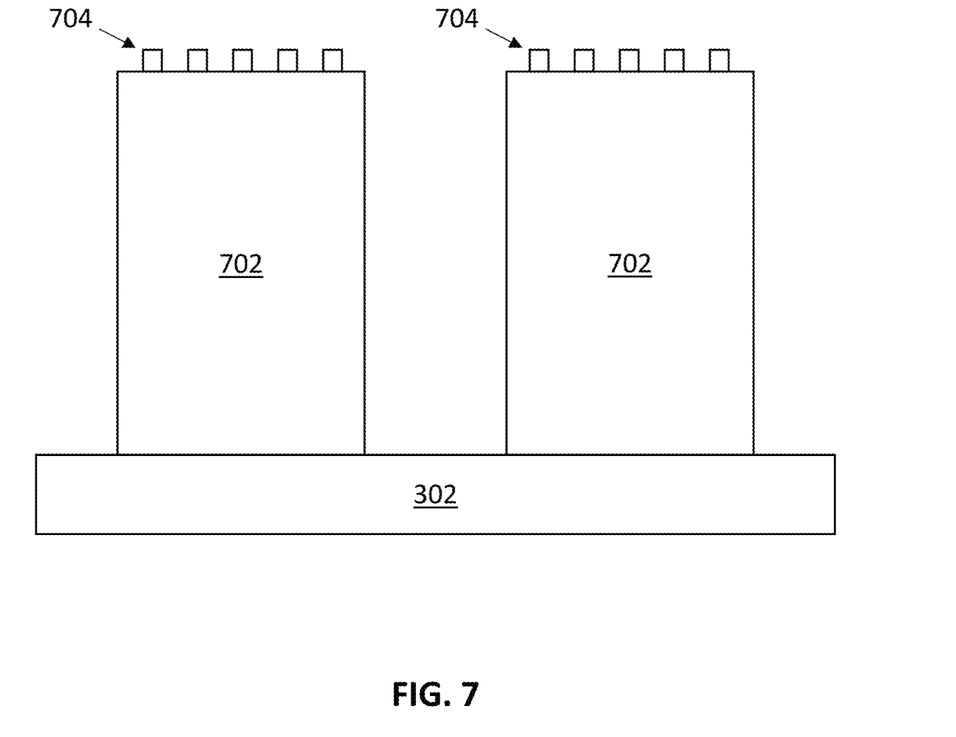
FIG. 7 illustrates a side view of a portion of an optical source having subwavelength structures, in accordance with an embodiment of the present disclosure.

FIG. 7 illustrates an example optical source having substrate 302 with a plurality of VCSEL structures 702. According to an embodiment, a plurality of SWS 704 is patterned on, or near, a top surface of one or more of the VCSEL structures 702. SWS 704 are provided to alter the phase of the light being emitted from the top surface of a given VCSEL structure 702. The phase may be altered differently across the surface of the VCSEL structure 702 such that some regions create constructive interference of the emitted light while other regions create destructive interference of the emitted light. By controlling where the regions of constructive/destructive interference are, the beam shape (e.g., pattern) of the emitted light can also be controlled.

SWS 704 may be formed using exceptionally high refractive index materials (>3.0). For example, SWS for beam shaping have been developed for near-infrared light using high refractive index material such as silicon. Table 1 below provides the refractive index of various materials at different visible wavelengths (460 nm—blue, 550 nm—green, and 650 nm—red.)

TABLE 1

| Wavelength (color) | a-Si | c-Si | TiO₂ | Hf₂O₃ | Si₃N₄ | Al₂O₃ | SiO₂ |
|---|---|---|---|---|---|---|---|
| 460 nm (Blue) | 4.95 | 4.68 | 2.6 | 2.11 | 2.06 | 1.78 | 1.53 |
| 550 nm (Green) | 4.46 | 4.07 | 2.48 | 2.07 | 2.03 | 1.77 | 1.52 |
| 650 nm (Red) | 4.07 | 3.85 | 2.42 | 2.05 | 2.02 | 1.77 | 1.51 |

Materials such as silicon may have a high refractive index, but these materials can also absorb an undesirably large percentage of impinging light (e.g., 40% or more) in the visible range (e.g. red, green and blue). Visible wavelength transparent materials, such as silicon nitride ($Si_3N_4$) with a refractive index of about 2.0, have not been considered to have a sufficiently high refractive index to support the optical resonance desired to effectively manipulate optical wave-fronts. Other materials such as titanium oxide ($TiO_2$) include a higher refractive index making them better suited to manipulate the optical wave-fronts, but such materials are challenging to fabricate at higher aspect ratios between 5:1-10:1. Table 2 below provides an overview of different materials, including their refractive index, thickness at maximum efficiency, max scattering efficiency, and light absorbance in the visible range. The maximum scattering efficiency is calculated by using periodic transmissive SWS as a model system that deflect a normally incident plane wave to a particular diffraction order.

TABLE 2

|  | SiO₂ | Al₂O₃ | Si₃N₄ | TiO₂ | Si | Ge |
|---|---|---|---|---|---|---|
| Refractive Index | 1.5 | 1.8 | 2 | 2.5 | 3.5 | 4 |
| Thickness at Max Efficiency (nm) | 1800 | 1600 | 1500 | 1000 | 500 | 300 |
| Maximum Scattering Efficiency (%) | 20 | 40 | 50 | 80 | 95 | 95 |
| Light Absorbance in Visible Range | 0 | 0 | 0 | 0 | >40% | >90% |

As can be seen from Table 2, materials such as silicon and germanium have excellent scattering efficiency and high refractive index. But these materials also absorb light in the visible range due to their small band gap (and will partially absorb near-infrared wavelengths as well). Materials such as silicon oxide and aluminum oxide are virtually transparent in the visible range but have a low scattering efficiency thus limiting their usefulness as a candidate for a SWS material. Materials such as silicon nitride and titanium oxide provide a good mix of scattering efficiency and low light absorbance.

Figure 8:
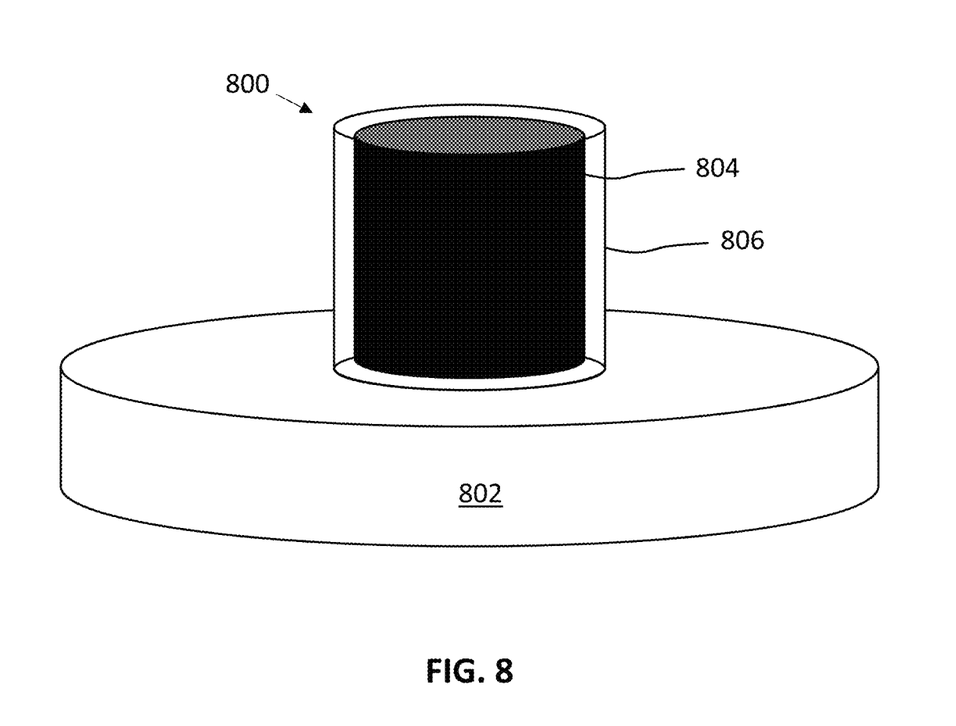
FIG. 8 illustrates a more detailed view of a subwavelength structure, in accordance with an embodiment of the present disclosure.

According to an embodiment, a new SWS design (herein referred to as a "meta atom") is fabricated that combines the high light confinement and low optical absorption in the visible and/or infrared range, while achieving high manufacturing throughput which is essential for low manufacturing cost. FIG. 8 illustrates an example meta atom 800 having a cylindrical shape with a core material 804 surrounded by a thin shell material 806, according to an embodiment. Meta atom 800 is fabricated on a top layer 802 of a VCSEL structure. Top layer 802 may be any layer of a VCSEL structure where light exits from, and thus the use of the word "top" does not limit the layer to any specific spatial or geometric relationship. Any of the VCSEL structures described herein may include one or more of meta atom 800 for steering the light output. It should be understood that only a single meta atom is illustrated for clarity, but that any number of meta atoms can be patterned on top layer 802.

Although a cylindrical shape is illustrated in this embodiment, any shapes may be used for meta atom 800.

Meta atom 800 may have a diameter that is based on the peak wavelength of the emitted light from the VCSEL. For example, meta atom 800 may have a total diameter ranging from $\lambda/10$-$\lambda/5$. Similarly, the total thickness of meta atom 800 is dependent on the peak wavelength of the emitted light from the VCSEL. For example, meta atom 800 may have a thickness of about $\lambda/2$.

Core material 804 may be a material having a relatively low refractive index, but a high deposition rate thus increasing throughput when fabricating meta atom 800. For example, core material 804 may be silicon nitride ($Si_3N_4$) and deposited using a chemical vapor deposition (CVD) or physical vapor deposition (PVD) technique. The deposited layer of silicon nitride may then be etched using a standard plasma etching process to form core material 804 of each meta atom 800.

Shell material 806 may be a material having a relative high refractive index (or at least higher than the refractive index of core material 804). For example, materials such as titanium oxide ($TiO_2$) or silicon may be used for shell material 806 and deposited very thin by using an atomic layer deposition (ALD) technique. ALD allows shell material 806 to conformally coat the outer surface of core material 804 at very low thicknesses. For example, shell material 806 may have a thickness of less than 10 nm, less than 5 nm, less than 1 nm, or a monolayer of atoms.

Figure 9A:
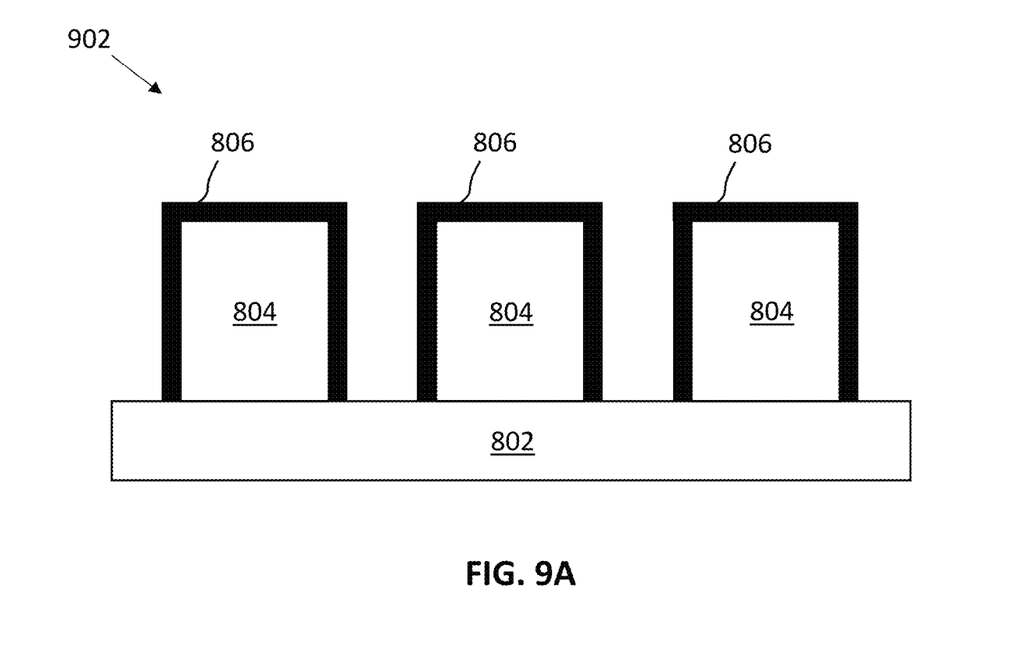
FIGS. 9A-9C illustrate example subwavelength structures, in accordance with embodiments of the present disclosure.
Figure 9B:
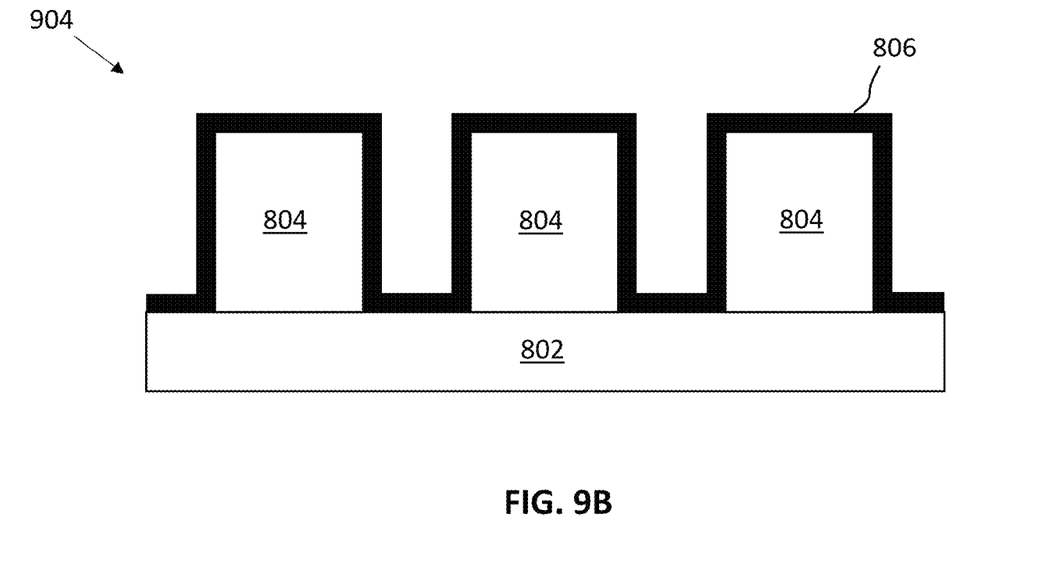
Figure 9C:
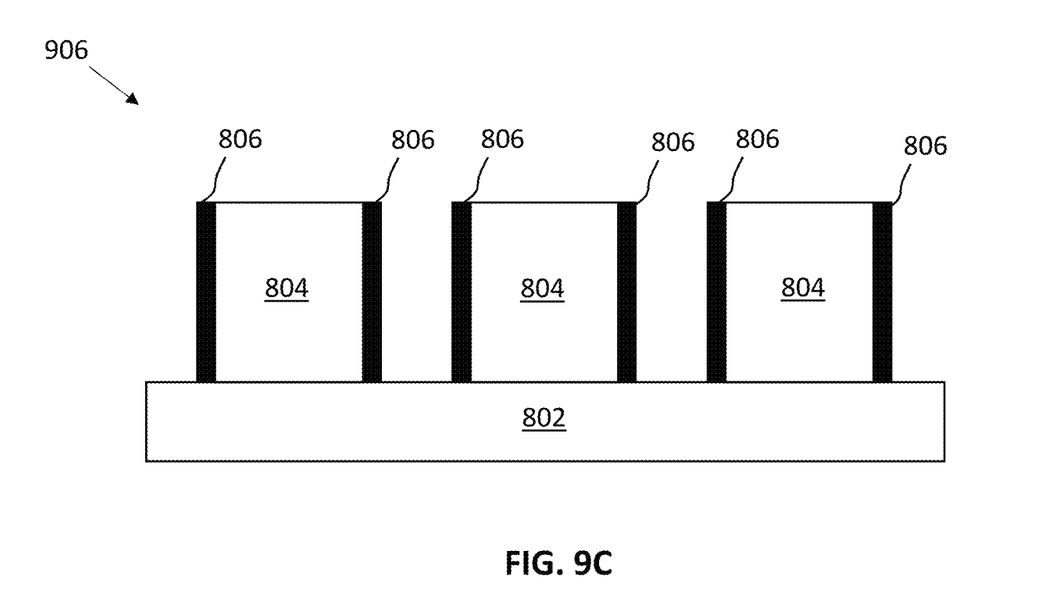

FIGS. 9A-9C illustrate different examples of meta atoms patterned over top layer 802 of a VCSEL structure, according to some embodiments. FIG. 9A illustrates a first meta structure 902 where shell material 806 surrounds core material 804 for each meta atom, but does not cover regions of top layer 802 between each meta atom. Portions of shell material 806 that surround core material 804 may be protected using, for example, a photoresist or a hardmask during an etching process to remove exposed portions of shell material 806 on the surface of top layer 802.

FIG. 9B illustrates a second meta structure 904 where shell material 806 conformally coats all surfaces including core material 804 and the surface of top layer 802. FIG. 9C illustrates a third meta structure 906 where shell material 806 only coats one or more sidewalls of core material 804. After deposition of shell material 806, a blanket anisotropic dry etch process may be performed to remove all horizontally planar portions of shell material 806, leaving only those portions on the sidewalls of core material 804.

Figure 10:
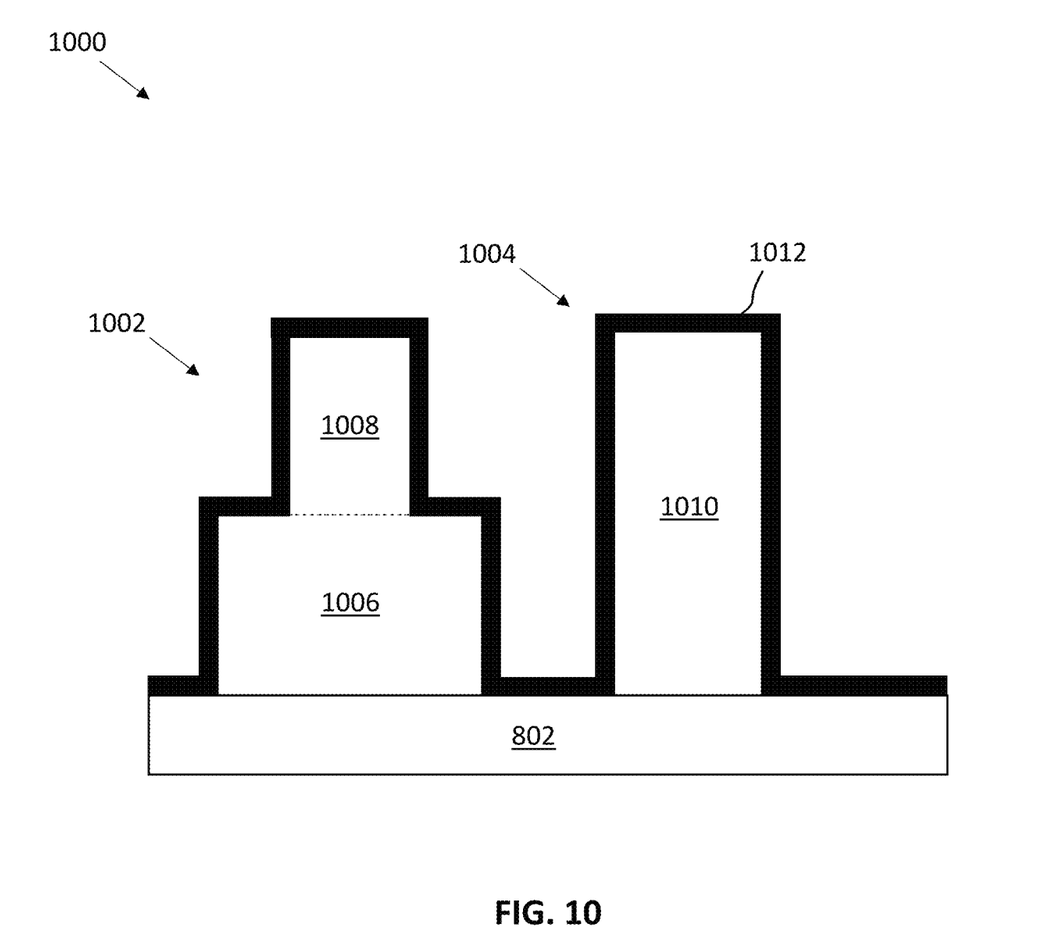
FIG. 10 illustrates an example of a meta molecule using subwavelength structures, in accordance with an embodiment of the present disclosure.
Figure 11:
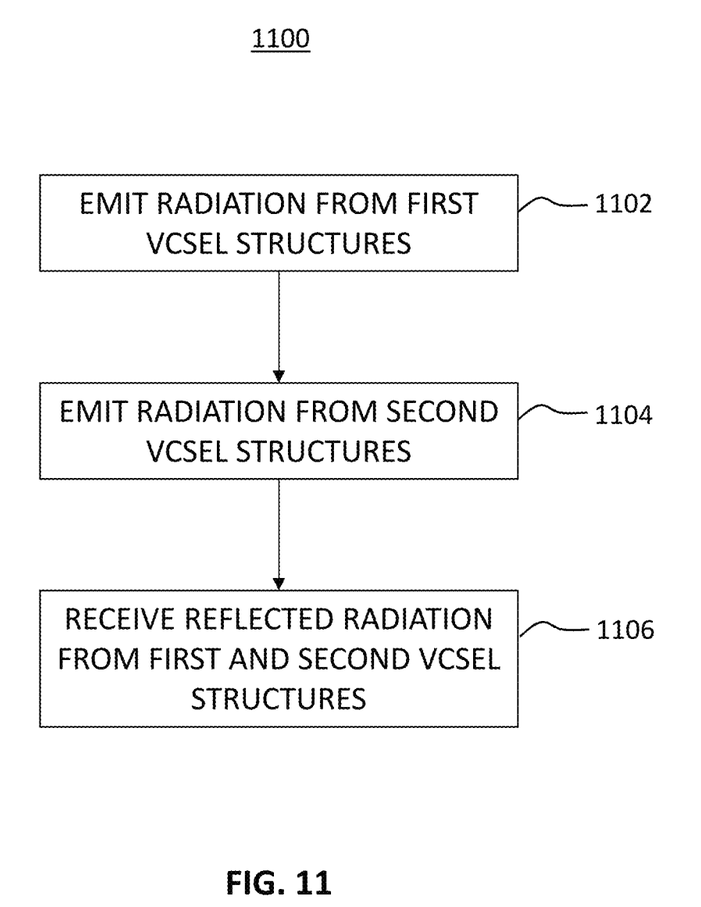
FIG. 11 is a flowchart illustrating a methodology for emitting radiation from an optical source used in a light projector system, in accordance with certain of the embodiments disclosed herein.

FIG. 10 illustrates another example of a meta structure 1000 that includes more than one type of meta atom (herein referred to as a "meta molecule"), according to an embodiment. First meta atom 1002 includes a core material having a base portion 1006 and a top portion 1008, according to an embodiment. Base portion 1006 may be wider or narrower than top portion 1008. Second meta atom 1004 includes a core material 1010, and both first and second meta atoms 1002 and 1004 are surrounded by shell material 1012. The core and shell materials for both first and second meta atoms 1002 and 1004 may include materials as described above for core material 804 and shell material 806 and be fabricated using the same techniques as described above for core material 804 and shell material 806.

Any number of meta atoms having any shape or size may be used together to form a meta molecule. A specific meta molecule structure may be repeated across the surface of top layer 802, or different meta molecule structures may be arranged across the surface of top layer 802. Meta molecules allow for different optical interactions, based on the different geometries of the individual meta atoms, to be combined.

Methodology

FIG. 7 is a flowchart illustrating an example method 700 for reducing speckle noise from a laser source, in accordance with an embodiment of the present disclosure. As can be seen, example method 700 includes a number of phases and sub-processes, the sequence of which may vary from one embodiment to another. However, when considered in the aggregate, these phases and sub-processes form a process for reducing speckle noise from a laser source in accordance with certain of the embodiments disclosed herein. These embodiments can be implemented, for example using the system architecture illustrated in FIG. 2, as described above. However other system architectures can be used in other embodiments, as will be apparent in light of this disclosure. To this end, the correlation of the various functions shown in FIG. 7 to the specific components illustrated in FIG. 2 is not intended to imply any structural and/or use limitations. Rather other embodiments may include, for example, varying degrees of integration wherein multiple functionalities are effectively performed by one system. Numerous variations and alternative configurations will be apparent in light of this disclosure.

As illustrated in FIG. 7, in one embodiment, method 700 for reducing speckle noise from a laser source commences by emitting, at operation 702, radiation from a first plurality of VCSEL structures. The radiation may include visible light or infrared radiation. The radiation may have a peak wavelength between about 935 nm and about 945 nm. According to an embodiment, each of the first plurality of VCSEL structures has a same aperture width, such that the radiation emitted from the first plurality of VCSEL structures produces a first speckle pattern when illuminating an object. The radiation emitted from the first plurality of VCSEL structures includes a first number of transverse modes dictated, in part, by the aperture width.

Next, at operation 704, radiation is emitted from a second plurality of VCSEL structures. The second plurality of VCSEL structures may be arranged on the same substrate as the first plurality of VCSEL structures. The radiation may include visible light or infrared radiation. The radiation may have a peak wavelength between about 935 nm and about 945 nm. According to an embodiment, each of the second plurality of VCSEL structures has a same aperture width that is different than the aperture width of the first plurality of VCSEL structures, such that the radiation emitted from the second plurality of VCSEL structures produces a second speckle pattern when illuminating an object. The radiation emitted from the second plurality of VCSEL structures includes a second number of transverse modes dictated, in part, by the aperture width. The second number of transverse modes is different from the first number of transverse modes. For example, radiation emitted from the first plurality of VCSEL structures may include 2 or more transverse modes while radiation emitted from the second plurality of VCSEL structures having a smaller aperture width includes only a single transverse mode. The sizes of the aperture widths between the first plurality of VCSEL structures and the second plurality of VCSEL structures may be determined such that any number of different transverse lasing modes and speckle patterns are generated from the emitted radiation.

By emitting radiation from VCSEL structures having different aperture widths, the speckle noise can be reduced. In an example where two sets of VCSEL structures having two different aperture widths are used, the speckle noise is reduced by about √2. Additional arrays of VCSEL structures may be used, with each array having a different aperture width, to reduce the speckle noise by a factor of √N where N is the number of different VCSEL arrays.

Next, at operation 706, the radiation emitted by the first and second VSCEL structures is received at a detector after being reflected from an object. The received radiation may be used to define a digital 3D image of the object.

Of course, in some embodiments, additional operations may be performed, as previously described in connection with the system. In particular, radiation may be emitted from a third plurality of VCSEL structures arranged on the same substrate as the first and second pluralities of VCSEL structures. Each of the third plurality of VCSEL structures includes an aperture width different from the aperture widths of the first and second pluralities of VCSEL structures, such that the radiation emitted from the third plurality of VCSEL structures produces a third speckle pattern different from the first and second speckle patterns.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be appreciated, however, that the embodiments may be practiced without these specific details. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is a laser source. The laser source includes a substrate, one or more first VSCEL structures, and one or more second VCSEL structures. The one or more first VCSEL structures are on a surface of the substrate, each having a first aperture width, and each separately extending above the surface of the substrate. The one or more second VCSEL structures are on the surface of the substrate, each having a second aperture width different from the first aperture width, and each separately extending above the surface of the substrate.

Example 2 includes the subject matter of Example 1, wherein the one or more first VCSELs are in a first region on the surface of the substrate and the one or more second VCSELs are in a second region on the surface of the substrate different from the first region.

Example 3 includes the subject matter of Example 1 or 2, wherein the one or more first VCSELs and the one or more second VCSELs are in a pseudo-random pattern on the surface of the substrate.

Example 4 includes the subject matter of any one of Examples 1-3, wherein the one or more first VCSELs and the one or more second VCSELs are configured to emit infrared radiation.

Example 5 includes the subject matter of any one of Examples 1-4, wherein each of the one or more first VCSELs is configured to emit radiation having two or more transverse modes.

Example 6 includes the subject matter of any one of Examples 1-5, wherein each of the one or more second VCSELs is configured to emit radiation having a single transverse mode.

Example 7 includes the subject matter of any one of Examples 1-6, further comprising one or more third vertical cavity surface emitting laser (VCSEL) structures on the surface of the substrate, each having a third aperture width different from the first aperture width and the second aperture width, and each separately extending above the surface of the substrate.

Example 8 includes the subject matter of any one of Examples 1-7, wherein the one or more VCSEL structures has a top layer, and the laser source further comprises a plurality of subwavelength structures on the top layer of at least one of the one or more VCSEL structures.

Example 9 includes the subject matter of Example 8, wherein one or more of the subwavelength structures includes a core material and a shell material disposed on one or more surfaces of the core material, the shell material having a higher refractive index than the core material.

Example 10 is a light projector system. The light projector system includes a laser source configured to generate radiation transmitted towards an object and an image sensor configured to receive radiation reflected from the object. The laser source includes a substrate, one or more first VSCEL structures, and one or more second VCSEL structures. The one or more first VCSEL structures are on a surface of the substrate, each having a first aperture width, and each separately extending above the surface of the substrate. The one or more second VCSEL structures are on the surface of the substrate, each having a second aperture width different from the first aperture width, and each separately extending above the surface of the substrate.

Example 11 includes the subject matter of Example 10, wherein the one or more first VCSELs are in a first region on the surface of the substrate and the one or more second VCSELs are in a second region on the surface of the substrate different from the first region.

Example 12 includes the subject matter of Examples 10 or 11, wherein the one or more first VCSELs and the one or more second VCSELs are in a pseudo-random pattern on the surface of the substrate.

Example 13 includes the subject matter of any one of Examples 10-12, wherein the one or more first VCSELs and the one or more second VCSELs are configured to emit infrared radiation.

Example 14 includes the subject matter of any one of Examples 10-13, wherein each of the one or more first VCSELs is configured to emit radiation having two or more transverse modes.

Example 15 includes the subject matter of Example 14, wherein each of the one or more second VCSELs is configured to emit radiation having a single transverse mode.

Example 16 includes the subject matter of any one of Examples 10-15, wherein the laser source further comprises one or more third vertical cavity surface emitting laser (VCSEL) structures on the surface of the substrate, each having a third aperture width different from the first aperture width and the second aperture width, and each separately extending above the surface of the substrate.

Example 17 includes a method of reducing speckle noise from a laser source. The method includes emitting radiation having a first wavelength from one or more first VCSEL structures arranged on a substrate, and emitting radiation having a second wavelength from one or more second VCSEL structures arranged on the substrate, the second wavelength being different from the first wavelength. The radiation having the first wavelength includes a first number of transverse modes, and the radiation having the second wavelength includes a second number of transverse modes different from the first number of transverse modes.

Example 18 includes the subject matter of Example 17, wherein emitting radiation having the first wavelength comprises emitting infrared radiation, and wherein emitting radiation having the second wavelength comprises emitting infrared radiation.

Example 19 includes the subject matter of Examples 17 or 18, wherein the second wavelength is lower than the first wavelength and the second number of transverse modes is less than the first number of transverse modes.

Example 20 includes the subject matter of any one of Example 19, wherein the second number of transverse modes includes only a single transverse mode.

Example 21 includes the subject matter of any one of Examples 17-20, further comprising reducing the speckle noise by about 50%.

Example 22 includes the subject matter of any one of Examples 17-21, further comprising emitting radiation having a third wavelength from one or more third VCSEL structures arranged on the substrate, the third wavelength being different from the first wavelength and the second wavelength.

Example 23 is a laser source. The laser source includes a substrate, a VCSEL structure, and a plurality of subwavelength structures. The VCSEL structure is on a surface of the substrate and extends above the surface of the substrate. The plurality of subwavelength structures is on a top layer of the VCSEL structure. One or more of the plurality of subwavelength structures includes a core material and a shell material on one or more surfaces of the core material.

Example 24 includes the subject matter of Example 23, wherein the plurality of subwavelength structures comprises cylindrical structures.

Example 25 includes the subject matter of Example 24, wherein each of the subwavelength structures has a diameter between $\lambda/10$ and $\lambda/5$, where $\lambda$ is the peak output wavelength of the VCSEL structure.

Example 26 includes the subject matter of any one of Examples 23-25, wherein the shell material has a higher refractive index than the core material.

Example 27 includes the subject matter of Example 26, wherein the shell material comprises titanium oxide and the core material comprises silicon nitride.

Example 28 includes the subject matter of any one of Examples 23-27, wherein the shell material is only on sidewalls of the core material.

Example 29 includes the subject matter of any one of Examples 23-28, wherein each of the subwavelength structures has a thickness of about $\lambda/2$, where $\lambda$ is the peak output wavelength of the VCSEL structure.

Example 30 includes the subject matter of any one of Examples 23-29, further comprising a plurality of VSCEL structures on the surface of the substrate, wherein each of the plurality of VCSEL structures includes the plurality of subwavelength structures.

Example 31 includes the subject matter of any one of Examples 23-30, wherein the plurality of subwavelength structures includes at least one subwavelength structure having a base portion and a top portion, wherein the base portion is wider than the top portion.

Example 32 includes the subject matter of any one of Examples 23-31, wherein the plurality of subwavelength structures includes at least one subwavelength structure having a base portion and a top portion, wherein the base portion is narrower than the top portion.

Example 33 is a subwavelength structure arranged on an optical device. The subwavelength structure includes a core material, and a shell material on one or more surfaces of the core material. The core material has a first refractive index and has dimensions smaller than a peak output wavelength of the optical source. The shell material has a second refractive index greater than the first refractive index.

Example 34 includes the subject matter of Example 33, wherein the core material is a cylindrical structure.

Example 35 includes the subject matter of Example 34, wherein the core material together with the shell material has a diameter between $\lambda/10$ and $\lambda/5$, where $\lambda$ is the peak output wavelength of the optical source.

Example 36 includes the subject matter of any one of Examples 33-35, wherein the shell material has a thickness less than 5 nm.

Example 37 includes the subject matter of any one of Examples 33-36, wherein the shell material comprises titanium oxide and the core material comprises silicon nitride.

Example 38 includes the subject matter of any one of Examples 33-37, wherein the shell material is only on sidewalls of the core material.

Example 39 includes the subject matter of any one of Examples 33-38, wherein the core material together with the shell material has a thickness of about $\lambda/2$, where $\lambda$ is the peak output wavelength of the optical source.

Example 40 includes the subject matter of any one of Examples 33-39, wherein the shell material comprises silicon.

Example 41 includes the subject matter of any one of Examples 33-40, wherein the core material has a base portion and a top portion, and the base portion is wider than the top portion.

Example 42 includes the subject matter of any one of Examples 33-40, wherein the core material has a base portion and a top portion, and the base portion is narrower than the top portion.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood in light of this disclosure. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A laser source, comprising:
    a substrate;
    one or more first vertical cavity surface emitting laser (VCSEL) structures on a surface of the substrate, each having a first aperture width, and each separately extending above the surface of the substrate, wherein at least one of the first VCSEL structures is configured to emit radiation having a first number of one or more transverse modes; and
    one or more second VCSEL structures on the surface of the substrate, each having a second aperture width different from the first aperture width, and each separately extending above the surface of the substrate, wherein at least one of the second VCSEL structures is configured to emit radiation having a second number of one or more transverse modes, the second number being different from the first number.

2. The laser source of claim 1, wherein the one or more first VCSELs are in a first region on the surface of the substrate and the one or more second VCSELs are in a second region on the surface of the substrate different from the first region.

3. The laser source of claim 1, wherein one or more of the first VCSELs and a plurality of the second VCSELs, or a plurality of the first VCSELs and one or more of the second VCSELs, are in a pseudo-random pattern on the surface of the substrate.

4. The laser source of claim 1, wherein each of the one or more first VCSELs and the one or more second VCSELs are configured to emit infrared radiation.

5. The laser source of claim 1, wherein each of the one or more first VCSELs is configured to emit radiation having two or more transverse modes.

6. The laser source of claim 5, wherein each of the one or more second VCSELs is configured to emit radiation having a single transverse mode.

7. The laser source of claim 1, further comprising:
    one or more third vertical cavity surface emitting laser (VCSEL) structures on the surface of the substrate, each having a third aperture width different from the first aperture width and the second aperture width, and each separately extending above the surface of the substrate.

8. The laser source of claim 1, wherein the one or more first VCSEL structures have a top layer, the laser source further comprising:
    a plurality of subwavelength structures on the top layer of at least one of the one or more VCSEL structures.

9. The laser source of claim 8, wherein one or more of the subwavelength structures includes a core material and a shell material disposed on one or more surfaces of the core material, the shell material having a higher refractive index than the core material.

10. A light projector system, the system comprising:
    a laser source configured to generate radiation transmitted towards an object, the laser source including
        a substrate,
        one or more first VCSEL structures on a surface of the substrate, each having a first aperture width, and each separately extending above the surface of the substrate, wherein at least one of the first VCSEL structures is configured to emit radiation having a first number of one or more transverse modes, and
        one or more second VCSEL structures on the surface of the substrate, each having a second aperture width different from the first aperture width, and each separately extending above the surface of the substrate, wherein at least one of the second VCSEL structures is configured to emit radiation having a second number of one or more transverse modes, the second number being different from the first number; and
    an image sensor configured to receive radiation reflected from the object.

11. The light projector system of claim 10, wherein the one or more first VCSELs are in a first region on the surface of the substrate and the one or more second VCSELs are in a second region on the surface of the substrate different from the first region.

12. The light projector system of claim 10, wherein one or more of the first VCSELs and a plurality of the second VCSELs, or a plurality of the first VCSELs and one or more of the second VCSELs, are in a pseudo-random pattern on the surface of the substrate.

13. The light projector system of claim 10, wherein each of the one or more first VCSELs and the one or more second VCSELs are configured to emit infrared radiation.

14. The light projector system of claim 10, wherein each of the one or more first VCSELs is configured to emit radiation having two or more transverse modes.

15. The light projector system of claim 14, wherein each of the one or more second VCSELs is configured to emit radiation having a single transverse mode.

16. The light projector system of claim 10, wherein the laser source further comprises:
one or more third vertical cavity surface emitting laser (VCSEL) structures on the surface of the substrate, each having a third aperture width different from the first aperture width and the second aperture width, and each separately extending above the surface of the substrate.

17. A method of reducing speckle noise from a laser source, the method comprising:
emitting radiation having a first wavelength from one or more first VCSEL structures arranged on a substrate; and
emitting radiation having a second wavelength from one or more second VCSEL structures arranged on the substrate, the second wavelength being different from the first wavelength,
wherein the radiation having the first wavelength includes a first number of one or more transverse modes, and the radiation having the second wavelength includes a second number of one or more transverse modes, the second number of one or more transverse modes being different from the first number of one or more transverse modes.

18. The method of claim 17, wherein emitting radiation having the first wavelength comprises emitting infrared radiation, and wherein emitting radiation having the second wavelength comprises emitting infrared radiation.

19. The method of claim 17, wherein the second wavelength is lower than the first wavelength and the second number of one or more transverse modes is less than the first number of one or more transverse modes.

20. The method of claim 19, wherein the second number of one or more transverse modes includes only a single transverse mode.

21. The method of claim 17, wherein emitting the radiation having the first wavelength and emitting the radiation having the second wavelength reduces speckle noise of the laser source by about 50%.

22. The method of claim 17, further comprising emitting radiation having a third wavelength from one or more third VCSEL structures arranged on the substrate, the third wavelength being different from the first wavelength and the second wavelength.

* * * * *